(12) United States Patent
Gotoh et al.

(10) Patent No.: US 7,262,085 B2
(45) Date of Patent: Aug. 28, 2007

(54) DISPLAY DEVICE

(75) Inventors: Hiroshi Gotoh, Kobe (JP); Toshihiro Kugimiya, Kobe (JP); Katsufumi Tomihisa, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 213 days.

(21) Appl. No.: 11/091,442

(22) Filed: Mar. 29, 2005

(65) Prior Publication Data
US 2005/0224795 A1    Oct. 13, 2005

(30) Foreign Application Priority Data
Apr. 12, 2004    (JP) ............... 2004-116965

(51) Int. Cl.
*H01L 21/00* (2006.01)
(52) U.S. Cl. ............... 438/149; 257/59; 257/72
(58) Field of Classification Search .......... 257/57, 257/59, 72; 438/149
See application file for complete search history.

(56) References Cited

U.S. PATENT DOCUMENTS

| | | | |
|---|---|---|---|
| 5,514,909 A | 5/1996 | Yamamoto et al. | |
| 6,033,542 A * | 3/2000 | Yamamoto et al. | 204/298.13 |
| 6,218,206 B1 * | 4/2001 | Inoue et al. | 438/30 |
| 6,252,247 B1 * | 6/2001 | Sakata et al. | 257/57 |
| 6,407,780 B1 * | 6/2002 | Sung | 349/43 |
| 2003/0207513 A1 * | 11/2003 | Saitou et al. | 438/200 |
| 2004/0126608 A1 | 7/2004 | Gotoh et al. | |
| 2005/0224795 A1 | 10/2005 | Gotoh et al. | |

FOREIGN PATENT DOCUMENTS

| | | |
|---|---|---|
| JP | 11-283934 | 10/1999 |
| JP | 11-284195 | 10/1999 |
| JP | 11-337976 | 12/1999 |
| JP | 2004-3005 | 1/2004 |
| KR | 2000-0022732 | 4/2000 |

OTHER PUBLICATIONS

U.S. Appl. No. 11/153,331, filed Jun. 16, 2005, Gotoh, et al.
U.S. Appl. No. 11/091,442, filed Mar. 29, 2005, Gotoh et al.

(Continued)

*Primary Examiner*—Jerome Jackson
*Assistant Examiner*—Anthony Ho
(74) *Attorney, Agent, or Firm*—Oblon, Spivak, McClelland, Maier & Neustadt, P.C.

(57) ABSTRACT

A display device includes an insulating substrate, a thin-film transistor arranged on the insulating substrate, a pixel electrode including a transparent electrode, and an aluminum alloy film as a connection wiring section for electrically connecting between the thin-film transistor and the pixel electrode. The aluminum alloy film is a multilayer aluminum alloy film including an aluminum alloy layer containing no nitrogen, and another aluminum alloy layer being arranged on the first layer and containing nitrogen. The nitrogen-containing layer ensures corrosion resistance against an alkaline solution. The nitrogen-containing aluminum alloy layer has been removed at least in a connection area with the pixel electrode so as to allow the pixel electrode to be directly connected to the first aluminum alloy layer.

7 Claims, 15 Drawing Sheets

OTHER PUBLICATIONS

U.S. Appl. No. 11/341,531, filed Jan. 30, 2006, Kugimiya, et al.
U.S. Appl. No. 11/349,520, Feb. 8, 2006, Gotoh, et al.
U.S. Appl. No. 11/377,266, filed Mar. 17, 2006, Takagi, et al.
U.S. Appl. No. 11/431,580, filed May 11, 2006, Kugimiya, et al.
U.S. Appl. No. 11/461,907, filed Aug. 2, 2006, Kawakami, et al.
U.S. Appl. No. 11/461,927, Aug. 2, 2006, Kugimiya, et al.

* cited by examiner

BACKGROUND ART FIG. 1
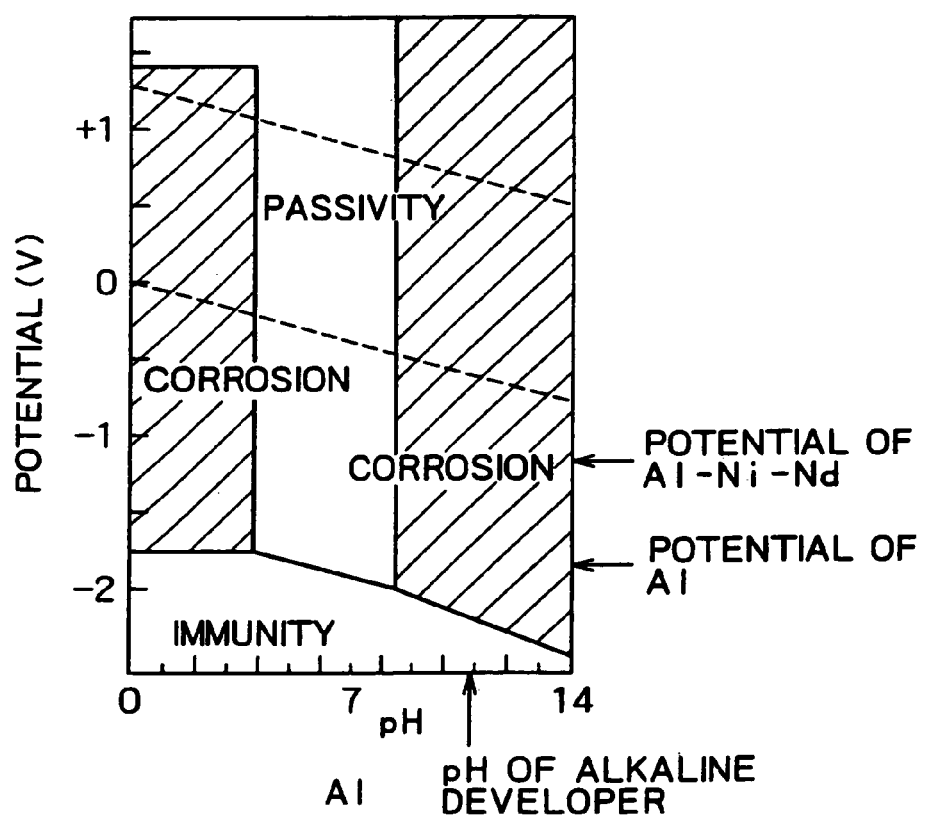

BACKGROUND ART     FIG. 2A
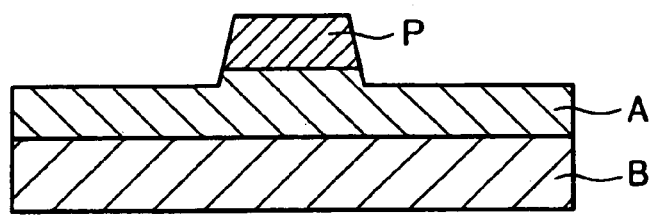
BACKGROUND ART     FIG. 2B
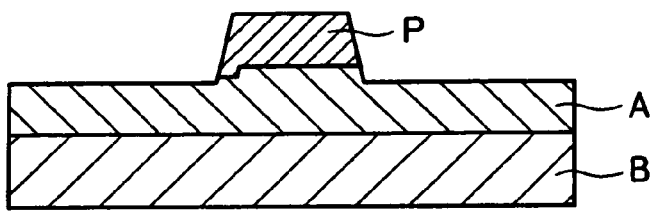
BACKGROUND ART     FIG. 2C
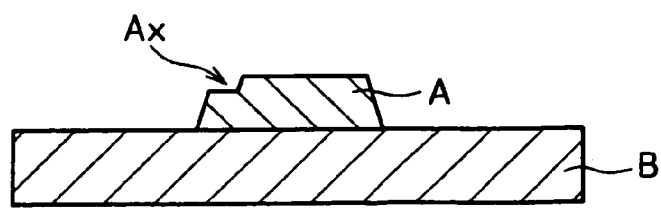

TEG PATTERN

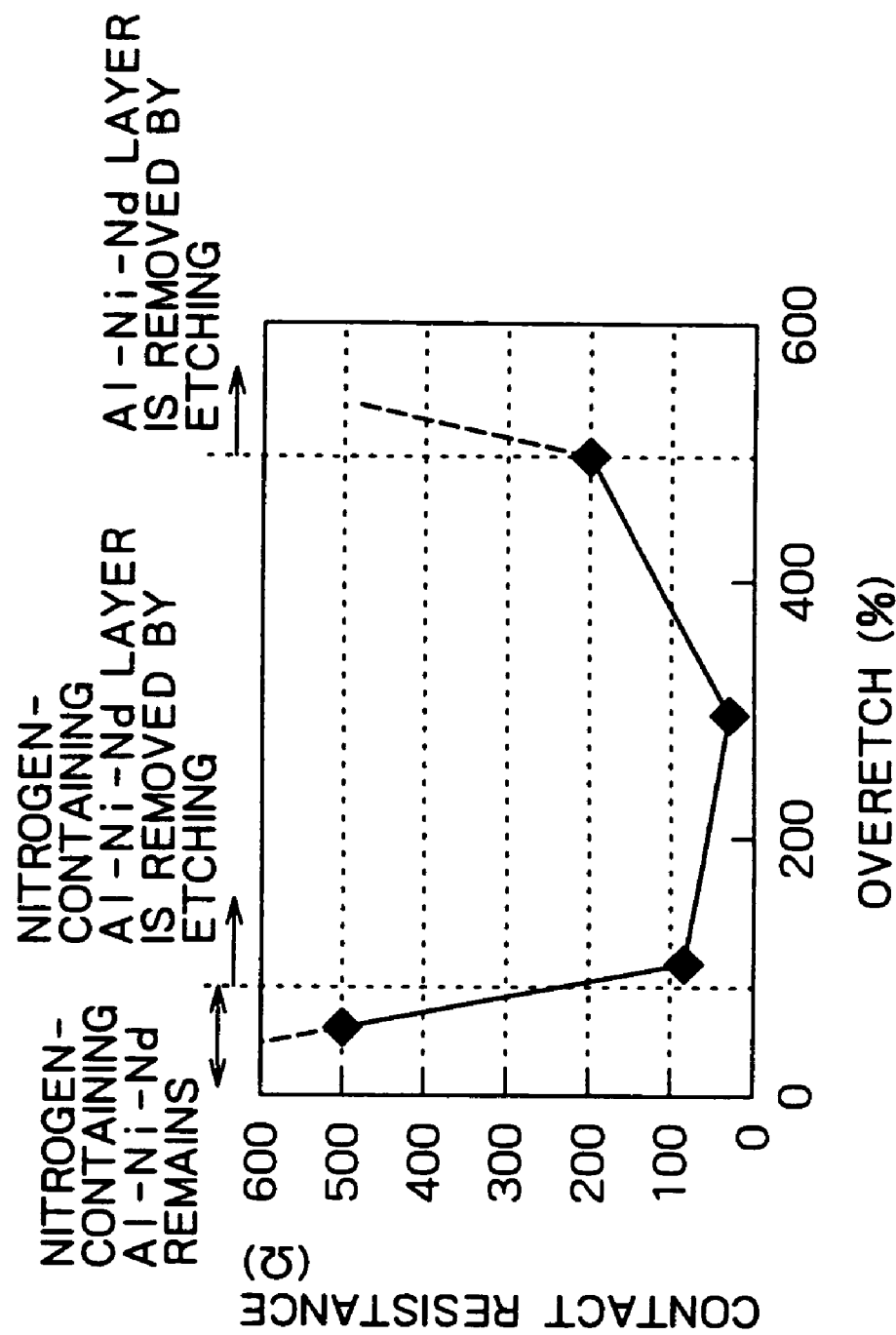

DISPLAY DEVICE

This application claims priority under 35 U.S.C. § 119 to Jap. Pat. Appl. 2004-116965.

BACKGROUND OF THE INVENTION

1. Field of the Invention

The present invention relates to a thin display device for use typically in semiconductors, liquid crystal displays and optical parts, and a method for fabricating the display device.

2. Description of the Related Art

An active-matrix liquid crystal display device includes a thin-film transistor (TFT) array substrate, a counter substrate facing the TFT array substrate at a predetermined distance, and a liquid crystal layer sandwiched between the TFT array substrate and the counter substrate. The TFT array substrate includes TFTs as a switching element, pixel electrodes, and a wiring unit containing scanning lines and data lines. The counter substrate includes a common electrode. A passive-matrix liquid crystal display device includes a wiring substrate, a counter substrate facing the wiring substrate at a predetermined distance, and a liquid crystal layer arranged between the wiring substrate and the counter substrate. The wiring substrate contains scanning lines and data lines. The counter substrate contains a common electrode.

As the pixel electrode, an indium tin oxide (ITO) film containing indium oxide ($In_2O_3$) and about 10 percent by weight of tin oxide (SnO) is generally used. The data line in the wiring unit to be electrically connected to the pixel electrode comprises, for example, aluminum (Al) or an aluminum alloy such as Al—Nd. A multilayer film of a refractory metal such as molybdenum (Mo), chromium (Cr), titanium (Ti) or tungsten (W) as a barrier metal is interposed between the data line and the pixel electrode, so as to avoid the aluminum or aluminum alloy from being in direct contact with the pixel electrode.

The present inventors have investigated on improvements in a liquid crystal display of this type and have invented an aluminum alloy film that enables direct connection between the wiring unit and the pixel electrode without using such a refractory metal and have filed a patent application as Japanese Patent Application No. 2003-368786.

As possible solutions to keep a low contact resistance between such an aluminum alloy wiring and a pixel electrode without using a refractory metal, Japanese Unexamined Patent Application Publication No. 11-283934 discloses a technique for treating a surface of a drain electrode typically containing an aluminum alloy by plasma treatment or ion injection; and Japanese Unexamined Patent Application Publication No. 11-284195 discloses a technique of forming a multilayer film including a second layer containing impurities such as N, O, Si or C on gate, source and drain electrodes in a first layer, which second layer is to be connected to a pixel electrode.

The aluminum alloy film constituting, for example, the drain electrode to be directly connected to the pixel electrode developed by the present inventors and disclosed in Japanese Patent Application No. 2003-368786 includes aluminum and a metal having a standard electric potential nobler than that of aluminum (−1.7 V), such as Ni (−0.25 V). The standard electric potential refers to an electrode potential with respect to hydrogen ion. Aluminum changes its electrode potential by alloying with the other metal such as Ni. Accordingly, an aluminum alloy film containing aluminum, 2 atomic percent of Ni and 0.6 atomic percent of Nd as disclosed in Japanese Unexamined Patent Application Publication No. 11-284195 has an electrode potential in an alkaline developer at pH of 12.7 of −1.3 V, 0.6 V nobler than that (−1.9 V) of a pure aluminum film in the alkaline developer.

Aluminum is an amphoteric metal, and pure aluminum is inherently not so resistant against an acid and a base. Under regular conditions, however, such an aluminum film has a dense passive film (aluminum oxide layer) on its surface and becomes relatively resistant against corrosion. Corrosion proceeds in various manners. Galvanic corrosion caused by a local cell phenomenon becomes significant in such an alloy. The corrosion rate in galvanic corrosion varies greatly depending on the pH of the developer and the electrode potential of the thin film.

FIG. 1 is a graph showing the relationship between the corrosion of aluminum and the electrode potential and pH of the alkaline developer. Aluminum becomes more susceptible to corrosion with the pH of the alkaline developer approaching 1 or 14 and with a decreasing (becoming more noble) electrode potential. FIG. 1 shows that pure aluminum is less susceptible to corrosion than the Al—Ni—Nd alloy even though it is in the corrosive region.

The corrosion can be prevented if such an aluminum alloy has a nobler potential in a stable region of water (in a region at potentials of −0.75 V to 0.48 V in an alkaline developer of pH of 12.7). It is difficult, however, to allow an alloy mainly containing aluminum to have such a high potential, since the aluminum alloy must keep a low electric resistivity. In other words, an aluminum alloy film in the wiring unit to be directly connected to the pixel electrode becomes more susceptible to corrosion than pure aluminum in terms of designing. It has been experimentally verified that an aluminum alloy has an increased corrosion rate with respect to an alkaline solution.

Among such alkaline solutions (basic solutions) with which aluminum can be in direct contact, alkaline developers for use in developing of a photoresist are strongly basic. Such developers are roughly classified as organic aqueous alkaline developers, inorganic aqueous alkaline developers, and developers in organic solvents. Among them, organic aqueous basic solutions containing tetramethylammonium hydroxide (TMAH) are generally used.

Aluminum does not corrode in developers in organic solvents. It does not significantly corrode in inorganic aqueous alkaline developers, because an inhibitor for inhibiting the corrosion of aluminum can be added thereto. Organic aqueous alkaline developers, however, cannot be incorporated with an inhibitor and may invite corrosion. In addition, a stripping agent containing an amine or its derivative for use in removal of a photoresist becomes alkaline when mixed with water.

If pure aluminum is dipped in such a basic solution for a time set in general fabrication processes, it is significantly prevented from corroding by the anti-corrosion action of the passive film. An aluminum alloy film containing aluminum and an alloy element such as Ni, however, has a nobler electrode potential within the corrosive region as in the pH-potential diagram of FIG. 1. An experiment has verified that an aluminum alloy containing about 2 atomic percent of Ni has an etching rate about five times (about 60 nm/min.) larger than the etching rate (12 nm/min.) of pure aluminum when dipped in an organic aqueous alkaline developer having a pH of 12.7 and containing 2.4 percent by weight of TMAH.

In fabrication of a liquid crystal panel, for example, an alkaline developer comes in direct contact with an aluminum alloy film in a lithography process for forming a wiring pattern on the aluminum alloy film by using a photoresist. The aluminum alloy film is generally etched by using the photoresist as a mask in a subsequent process, and there is no harm in remaining some region not covered by the photoresist or in etching all the region.

Misregistration of patterns formed by using a photoresist, however, may often occur in the photolithography process. In this case, a "rework" process is carried out, in which the photoresist is stripped and the photolithography process is carried out again. If any portion of the aluminum alloy film not covered by the photoresist is corroded in the first photolithography process, the second pattern cannot be registered at the very same position, which may invite a step in the wiring unit as shown in schematic sectional views of FIGS. 2A, 2B and 2C.

More specifically, there is no problem when the aluminum alloy A is etched in exact accordance with a designed pattern by the photoresist P in the first photolithography process (FIG. 2A). However, a pattern failure in which the aluminum alloy A is not covered by the photoresist, if occurred in the patterning process, invites misregistration in the rework process where the pattern is again covered by the photoresist (FIG. 2B), and the resulting step Ax remains to the last (FIG. 2C), which may invite contact failure.

SUMMARY OF THE INVENTION

Under these circumstances, an object of the present invention is to provide a technique for easily and precisely patterning an aluminum alloy film for constituting, for example, a drain electrode to be connected to a pixel electrode in a thin display device for use in liquid crystal displays and optical parts. Another object of the present invention is to provide a technique for reliably producing a high-quality display device.

The present invention provides, in an aspect, a display device including a transparent insulating substrate, a thin-film transistor arranged on the transparent insulating substrate, a pixel electrode comprising a transparent electrode, and an aluminum alloy film for electrically connecting between the thin-film transistor and the pixel electrode, wherein the aluminum alloy film is a multilayer aluminum alloy film including a first aluminum alloy layer containing an aluminum alloy being substantially free from nitrogen, and a second aluminum alloy layer being arranged adjacent to the first layer and including a nitrogen-containing aluminum alloy, and wherein the second aluminum alloy layer has been removed at least in a region, where the pixel electrode is in contact with the multilayer aluminum alloy film, so as to allow the pixel electrode to be directly connected to the first aluminum alloy layer.

The aluminum alloy film mainly contains aluminum and may further contain one or more alloy components. The aluminum alloy for use in the present invention is preferably an Al—Ni alloy containing 0.1 to 6 atomic percent of Ni as an alloy component. The aluminum alloy is also preferably a ternary or higher aluminum alloy containing Ni and 0.1 to 6 atomic percent of at least one element selected from the group consisting of Nd, Y, Fe and Co.

The thickness of the second aluminum alloy layer in the multilayer aluminum alloy film is preferably from about 5 to about 200 nm. The second aluminum alloy film, i.e., the nitrogen-containing aluminum alloy layer, preferably contains 3 to 50 atomic percent of nitrogen and preferably has a thickness of from about 5 to about 200 nm.

The present invention further provides a method for industrially advantageously fabricating the display device, namely, a method for fabricating a display device, including the steps of:

(1) forming a first aluminum alloy layer on a transparent insulating substrate, the first aluminum alloy layer including an aluminum alloy being substantially free from nitrogen, (2) forming a second aluminum alloy layer on the first aluminum alloy layer to thereby form a multilayer aluminum alloy film, the second aluminum alloy layer including an aluminum alloy containing nitrogen, (3) patterning the multilayer aluminum alloy film including the first aluminum alloy layer and the second aluminum alloy layer, (4) forming a dielectric film so as to cover the multilayer aluminum alloy film, (5) forming a contact hole in the dielectric film, (6) etching the second aluminum alloy layer at least in a region where the multilayer aluminum alloy film is in contact with the contact hole, and (6) forming a pixel electrode on the dielectric film and allowing the pixel electrode to be directly connected to the first aluminum alloy layer via the contact hole.

In the method, the step (5) of forming a contact hole in the dielectric film preferably also serves as the step (6) of etching the second aluminum alloy layer for more simple manufacturing process.

The present invention achieves the direct contact between an aluminum alloy wiring and a pixel electrode without using a barrier metal, provides a display device having high chemical resistance against, for example, alkaline developers and/or stripping solutions and provides a method for effectively manufacturing the display device.

Further objects, features and advantages of the present invention will become apparent from the following description of the preferred embodiments with reference to the attached drawings.

BRIEF DESCRIPTION OF THE DRAWINGS

FIG. 1 is a diagram showing the relationship between corrosion and the pH and potential of aluminum and an aluminum alloy;

FIGS. 2A, 2B and 2C are schematic diagrams showing patterning of a single-layer wiring film of an aluminum alloy on a substrate;

FIG. 24 is a graph showing the relationship between the overetching and the contact resistance of an Al—Ni—Nd alloy.

DESCRIPTION OF THE PREFERRED EMBODIMENTS

Misregistration of an electrode pattern on an aluminum alloy film in photolithography process must be avoided, to yield a high-performance liquid crystal device, as described in FIGS. 2A, 2B and 2C. To this end, a film or coating resistant against corrosion by an alkaline developer used in a patterning process should be effectively formed on the aluminum alloy film.

Pure aluminum is highly resistant to a base because of a passive film, i.e., aluminum oxide, formed on its surface. The dense passive film is formed as a result of natural oxidation of aluminum and is highly resistant against a base. The aluminum oxide, however, has a very high electric resistance, and if a pixel electrode is brought into direct contact with the aluminum film bearing the passive film, the contact resistance between them is high due to high resistance of the passive film.

According to the invention of the present inventors disclosed in Japanese Patent Application No. 2003-368786, the pixel electrode can be driven with a low contact resistance without deteriorating display quality even though it is brought into direct contact with an aluminum alloy film. This is because aluminum oxide formed on a surface of the aluminum alloy film is not so dense, contains a relatively small amount of oxygen and can allow a current to flow with a lower contact resistance, as compared with the passive film on a surface of pure aluminum.

The aluminum alloy has a lower resistance against corrosion by against a basic solution than pure aluminum, and an aluminum oxide film formed thereon by reactive sputtering with oxygen addition is not so dense and is not so highly resistant against corrosion as the passive film formed on the surface of pure aluminum. The aluminum alloy film bearing the aluminum oxide film is considered to show a higher etching rate in a basic solution, because such a thin (not dense) aluminum oxide is dissolved out to form aluminate ions (Al $O_2$—). It has been verified that the etching rate of an aluminum alloy film containing Ni formed by sputtering in combination with oxygen addition is higher than the passive film formed on pure aluminum by a factor of about 60%.

After intensive investigations, the present inventors have found that an aluminum alloy film can have improved corrosion resistance against a basic solution with an increasing amount of nitrogen incorporated into the aluminum alloy film.

Figure 3:
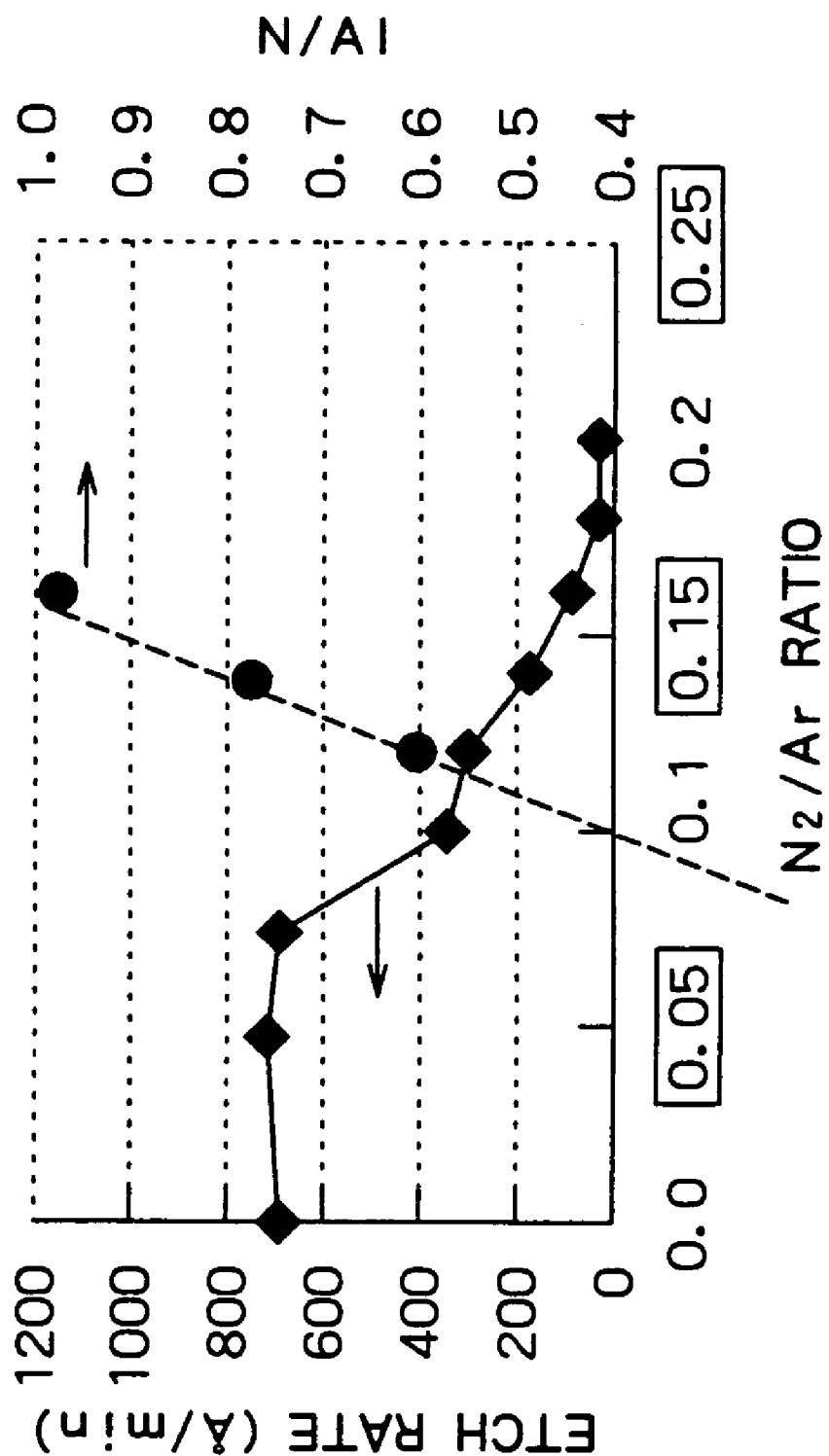
FIG. 3 is a graph showing the etching rate of an aluminum alloy layer comprising Al, 2 atomic percent of Ni and 0.6 atomic percent of Nd by an organic aqueous alkaline developer, plotted against the nitrogen feed rate and the nitrogen content.

FIG. 3 is a graph showing the etching rate of an aluminum alloy layer comprising Al, 2 atomic percent of Ni and 0.6 atomic percent of Nd with an organic aqueous alkaline developer ("NMD-W, available from Tokyo Ohka Kogyo Co., Ltd.), plotted against the nitrogen feed rate and nitrogen content. The aluminum alloy used herein is a representative aluminum alloy in the fabrication of a display device. The nitrogen feed rate is represented by the ratio of the flow rate of nitrogen gas to that of Ar gas in the formation of an aluminum alloy film by sputtering.

FIG. 3 shows that the etching rate abruptly changes at a ratio of the flow rate of about 0.1. A quantitative analysis using an X-ray photoelectron spectroscopy (XPS) has revealed that the atomic ratio (N/Al) of nitrogen to aluminum in the aluminum alloy film determined from the ratio of $N_{1s}$ to $Al_{2p}$ is 0.7 at a ratio of the flow rate of about 0.12, is 0.88 at a ratio of the flow rate of 0.14, and is 0.98 at a ratio of the flow rate of 0.16, indicating that the nitrogen content in the aluminum alloy film and the corrosion resistance increase with an increasing ratio of the flow rate of nitrogen. FIG. 3 shows that the ratio of flow rate at which the etching rate abruptly decreases is about 0.07, and the nitrogen content in terms of N/Al ratio is 0.13 at this point. The nitrogen content in the aluminum alloy film increases with an increasing ratio of the flow rate of nitrogen, but the upper limit of the nitrogen content is about 50 atomic percent, as in the case of stoichiometric AlN.

Nitrogen can be easily added to the aluminum alloy by reactive sputtering in which nitrogen is added to Ar gas during the formation of an aluminum alloy film by sputtering. The nitrogen content in the aluminum alloy film can be easily controlled by controlling the ratio of the flow rate of nitrogen to that of Ar gas. By changing the composition of the gas mixture, the aluminum alloy film can be continuously formed without exchanging the sputtering target. The resulting nitrogen-containing aluminum alloy has an increased resistance, and stoichiometric aluminum nitride (AlN) having an atomic ratio of aluminum to nitrogen of 1:1 is an insulator.

Figure 4:
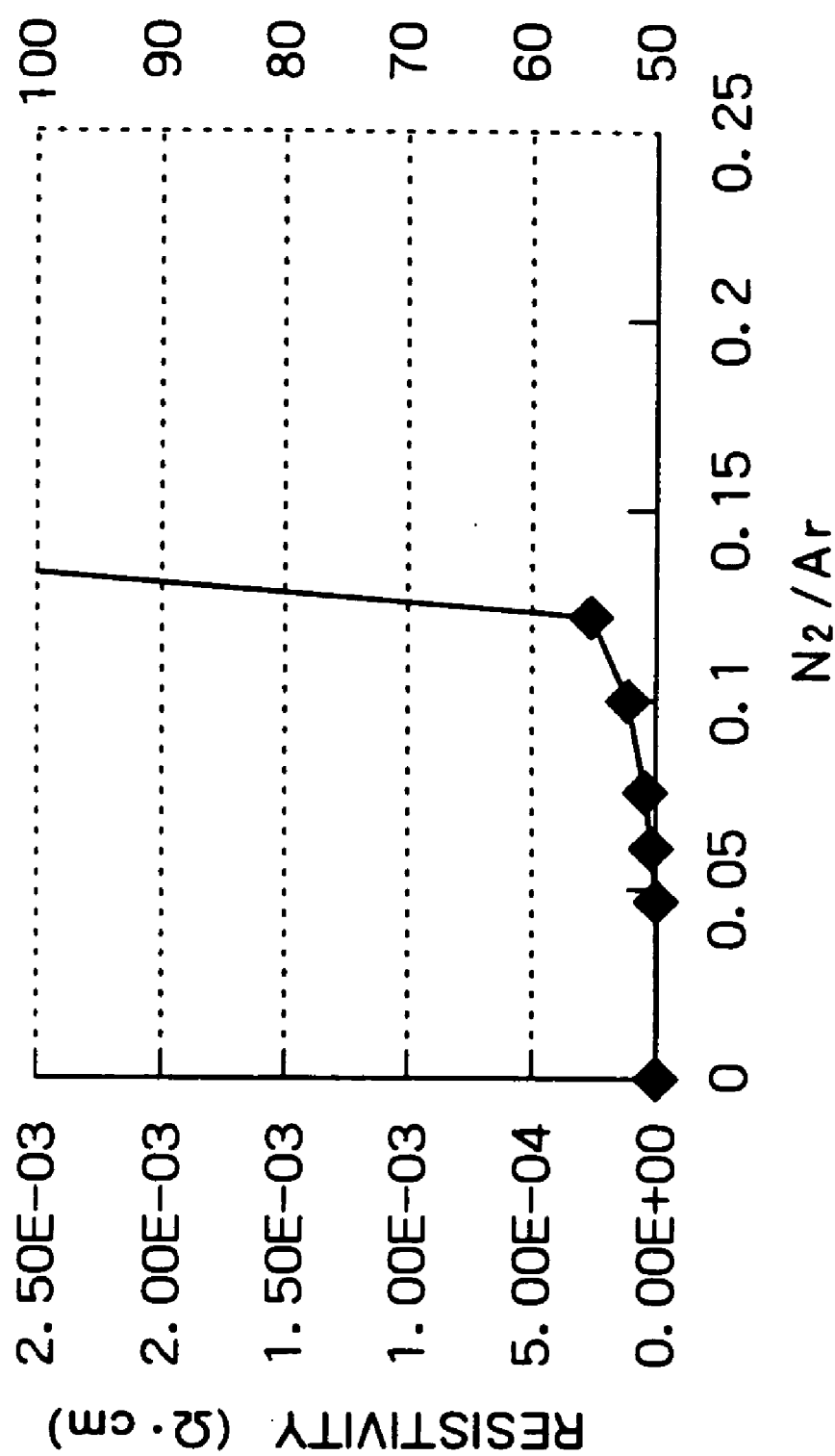
FIG. 4 is a graph of the electrical resistivity of an aluminum alloy layer comprising Al, 2 atomic percent of Ni and 0.6 atomic percent of Nd and further containing nitrogen, plotted against the nitrogen feed rate and the nitrogen content.

FIG. 4 is a graph showing the electric resistance of a nitrogen-containing aluminum alloy film, plotted against the ratio of flow rate of nitrogen (nitrogen content) to that of argon. Such a nitrogen-containing aluminum alloy film, if used as intact, cannot be used as a thin-film material for wiring in a liquid crystal panel because of its high electric resistance and cannot be brought into direct contact with an electrophotographic photoconductor due to its high contact resistance.

According to the present invention, an aluminum alloy film is converted into a multilayer aluminum alloy film by forming a nitrogen-containing aluminum alloy film as a second layer on a surface of the aluminum alloy film, for inhibiting the corrosion of the aluminum alloy film during photolithography process. The multilayer aluminum alloy film is then covered with a dielectric film. The nitrogen-containing aluminum alloy film as the second layer serving as a surface layer from the multilayer aluminum alloy film is removed so as to expose the aluminum alloy layer as the first layer only in a region where a pixel electrode is to be contact with, in the formation of a contact hole by etching the dielectric film. Thus, the aluminum alloy film as the first layer containing no nitrogen and having a low electric resistance can be brought into direct contact with the pixel electrode with a low contact resistance.

As possible solutions to keep a low contact resistance between such an aluminum alloy wiring and a pixel electrode without using a refractory metal, above-mentioned Japanese Unexamined Patent Application Publication No. 11-283934 discloses a technique for treating a surface of a drain electrode by plasma treatment or ion injection, and Japanese Unexamined Patent Application Publication No. 11-284195 discloses a technique of forming a multilayer film including a second layer containing impurities such as N, O, Si or C on gate, source, and drain electrodes as a first layer.

The multilayer aluminum alloy film used in the present invention, however, can improve the drawback, i.e. alkali resistance, of an aluminum alloy film capable of coming into direct contact with a pixel electrode with a low contact resistance by forming a nitrogen-containing aluminum alloy film as a second layer on a surface of the aluminum alloy film as a first layer. In addition, it can utilize the advantage of the aluminum alloy film, i.e., a low contact resistance, by removing the nitrogen-containing aluminum alloy film during or after formation of a contact hole to thereby expose the aluminum alloy film containing no nitrogen therefrom.

The aluminum alloy for use in the present invention is not specifically limited but is preferably an aluminum alloy containing nickel as an alloy component. Such a nickel-containing aluminum alloy has high electric conductivity as a wiring material and satisfactorily works when brought into direct contact with a pixel electrode. The Al—Ni alloy preferably contains 0.1 to 6 atomic percent, and more preferably 0.2 to 5 atomic percent of nickel.

The Al—Ni alloy preferably further comprises about 0.1 to about 6 atomic percent of at least one element selected from the group consisting of Nd, Y, Fe and Co as other alloy components, for yield a wiring material having further improved properties such as thermal resistance.

Some embodiments of the display device and fabrication method thereof according to the present invention will be illustrated below with reference to the drawings.

Figure 5:
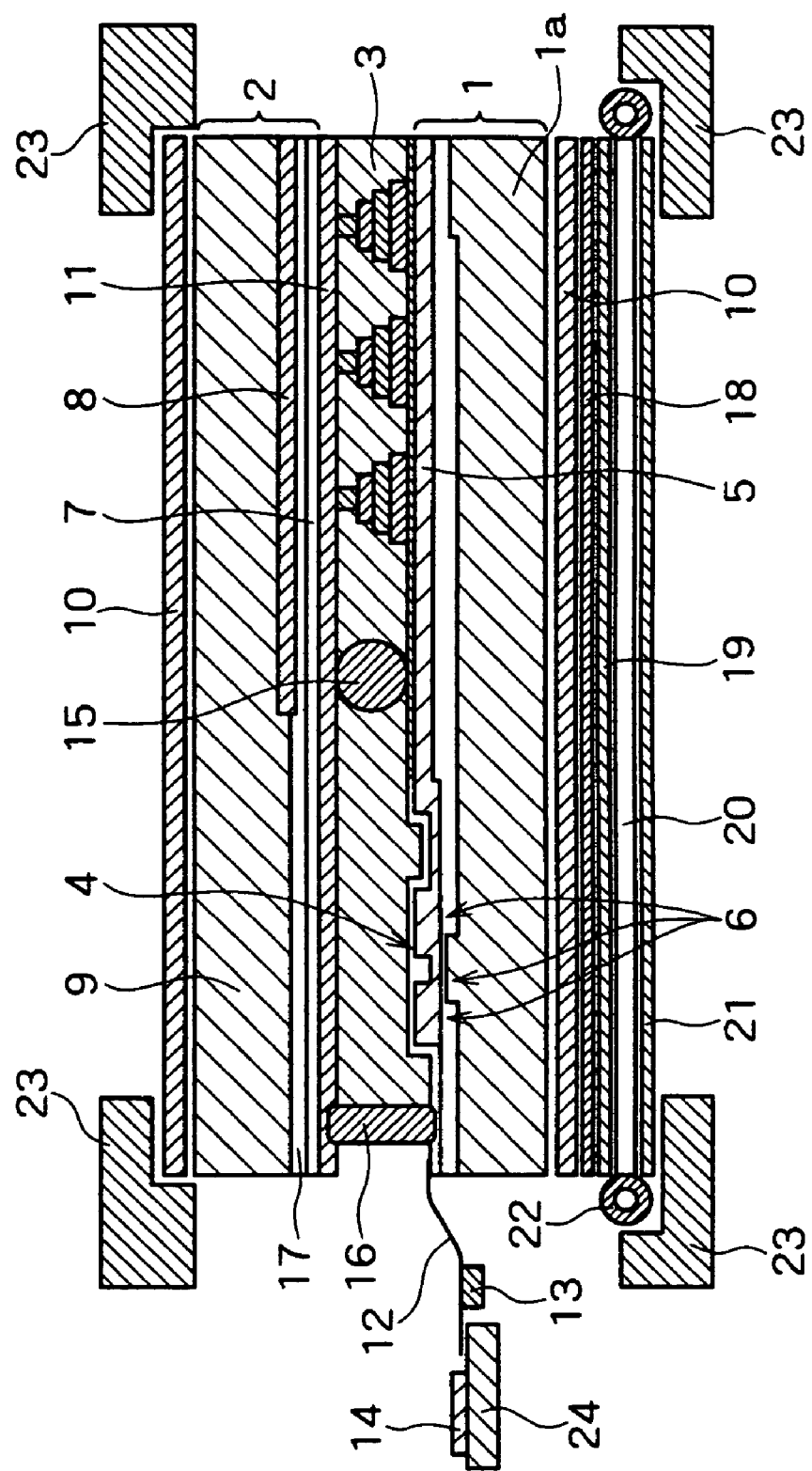
FIG. 5 is a schematic sectional view illustrating the configuration of a liquid crystal panel substrate and a liquid crystal display device to which an array substrate for display device according to the present invention is applied.

FIG. 5 is a schematic sectional view of the configuration of a liquid crystal panel substrate and a liquid crystal display device to which the present invention is applied. The liquid crystal panel shown in FIG. 5 comprises a TFT array substrate 1, a counter substrate 2 facing the TFT array substrate 1, and a liquid crystal layer 3 arranged between the TFT array substrate 1 and the counter substrate 2 and serving as an optical modulation layer. The TFT array substrate 1 comprises an insulating substrate 1a typically of glass, a thin-film transistor (TFT) 4, a wiring section 6, and a shielding film 9 arranged so as to face the TFT 4 and the wiring section 6.

Polarizers 10 are arranged outside of insulating substrates constituting the TFT array substrate 1 and the counter substrate 2, respectively. An alignment film 11 is arranged on the counter substrate 2. The alignment film serves to align liquid crystal molecules in the liquid crystal layer 3 into a set direction.

In the liquid crystal panel, an electric field formed between the counter substrate 2 and a pixel electrode 5 controls the alignment direction of the liquid crystal molecules in the liquid crystal layer 3 so as to modulate light passing through the liquid crystal layer 3 arranged between the TFT array substrate 1 and the counter substrate 2. This controls the quantity of transmitted light passing through the counter substrate 2 to thereby display an image. The TFT array is driven via a tape automated bonding (TAB) tape 12 by the action of a driver IC 13 and a control IC 14. The TAB tape 12 is brought out of the TFT array.

FIG. 5 also illustrates a spacer 15, a sealing member 16, a protective film 17, a diffuser 18, a prism sheet 19, an optical waveguide 20, a passive reflector 21, a backlight 22, a holding frame 23, and a printed circuit board 24. These components will be described later.

Figure 6:
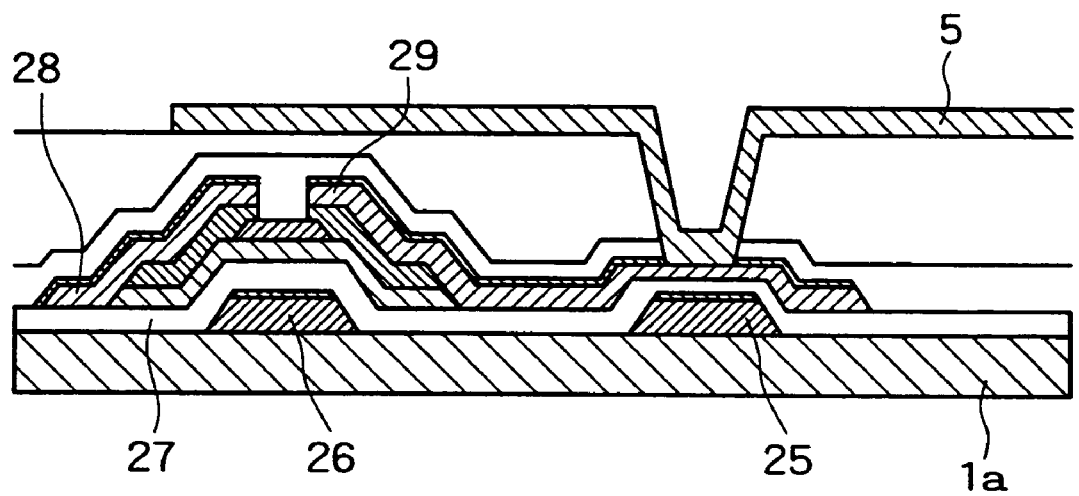
FIG. 6 is a schematic sectional view illustrating the configuration of a thin-film transistor applied to an display device array substrate according to a first embodiment of the present invention.

FIG. 6 is a schematic sectional view of the configuration of a thin-film transistor for use in an array substrate as a first embodiment according to the present invention. With reference to FIG. 6, a scanning line 25 of an aluminum alloy film is arranged on an insulating substrate 1a. Part of the scanning line 25 serves as a gate electrode 26 for controlling ON and OFF of the thin-film transistor. A data line comprising an aluminum alloy film is arranged so as to intersect the scanning line 25 with the interposition of a gate insulator (gate dielectric film) 27. Part of the data line serves as a source electrode 28 of the thin-film transistor.

A pixel electrode 5 is arranged in a pixel area on the gate insulator 27. The pixel electrode 5 comprises, for example, an ITO film containing $In_2O_3$ and SnO. A drain electrode 29 of the thin-film transistor comprises an aluminum alloy film and is in direct contact with and electrically connected to the pixel electrode 5.

When a gate voltage is fed via the scanning line 25 to the gate electrode 26 in the TFT array substrate 1, the thin-film transistor turns ON, and a driving voltage previously fed to the data line is fed from the source electrode 28 via the drain electrode 29 to the pixel electrode 5. Upon feeding the driving voltage at a set level to the pixel electrode 5, a potential difference with the counter substrate 2 occurs so as to align the liquid crystal molecules in the liquid crystal layer 3 to thereby modulate the light, as shown in FIG. 5.

The aluminum alloy films constituting, for example, the scanning line 25, the gate electrode 26, the source electrode 28 and the aluminum electrode 29 each comprise a multilayer aluminum alloy film comprising an aluminum alloy film containing no nitrogen and a nitrogen-containing aluminum alloy film according to the present invention. The configuration of the multilayer aluminum alloy film will be illustrated in detail later.

Next, the fabrication of the TFT array substrate shown in FIG. 6 will be briefly illustrated. In the following, an amorphous silicon TFT having a hydrogenated amorphous silicon as a semiconductor layer and serving as a switching element is taken as an example of the thin-film transistor.

The fabrication processes of the TFT array substrate 1 according to the first embodiment will be schematically illustrated with reference to FIGS. 7 to 14.

Initially, an aluminum alloy film (Al) containing no nitrogen having a thickness of about 200 nm is formed typically by sputtering on an insulating substrate 1a. Subsequently, a nitrogen-containing aluminum alloy film (N—Al) about 30 nm thick is formed on the aluminum alloy film (Al) typically by reactive sputtering in combination with nitrogen addition. The ratio ($N_2$/Al) of flow rate of $N_2$ to that of Ar is arbitrarily set depending on the target nitrogen content in the nitrogen-containing aluminum alloy film and is generally appropriately set within a range of 0.07 to 0.16.

Figure 7:
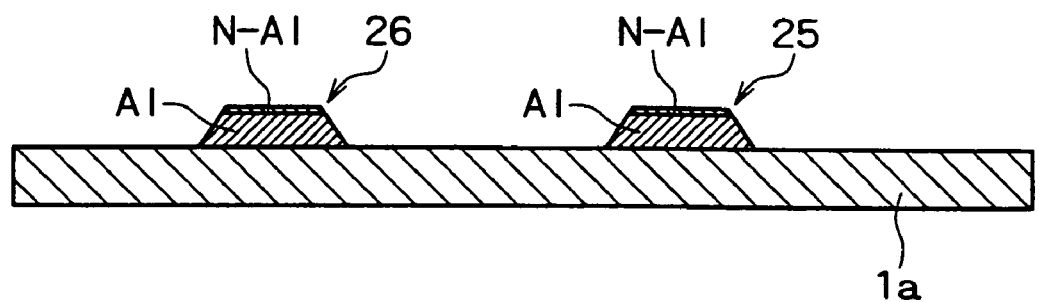
FIG. 7 is a schematic sectional view sequentially showing processes of a fabrication of the display device array substrate according to the first embodiment.

Next, the multilayer aluminum alloy film is patterned by photolithography to thereby form a gate electrode 26 and a scanning line 25 (FIG. 7). In this procedure, the corrosion of the aluminum alloy film by an alkaline developer is inhibited due to the corrosion resistance of the nitrogen-containing aluminum alloy film (N—Al) serving as a surface layer of the multilayer aluminum alloy film according to the present invention. Next, the multilayer aluminum alloy film is etched. In this procedure, the multilayer aluminum alloy film is preferably etched so as to make a tapered side edge of the multilayer aluminum alloy film at an angle of about 30 to about 40 degrees for satisfactory coverage of a gate insulator 27 to be formed thereon.

Figure 8:
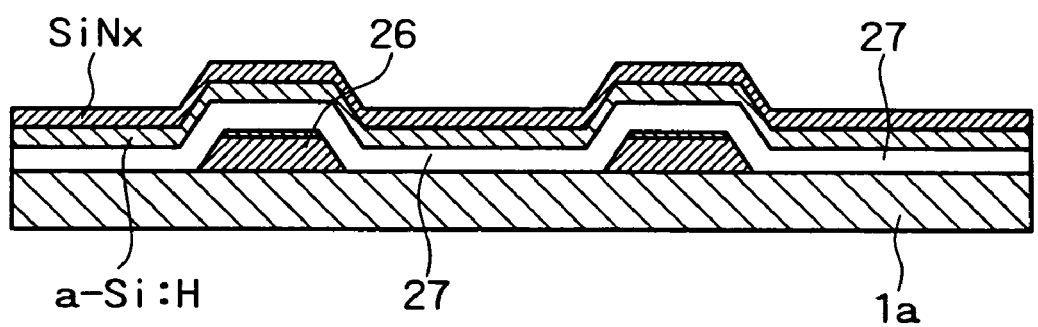
FIG. 8 is a schematic sectional view sequentially showing processes of the fabrication of the display device array substrate according to the first embodiment.
Figure 9:
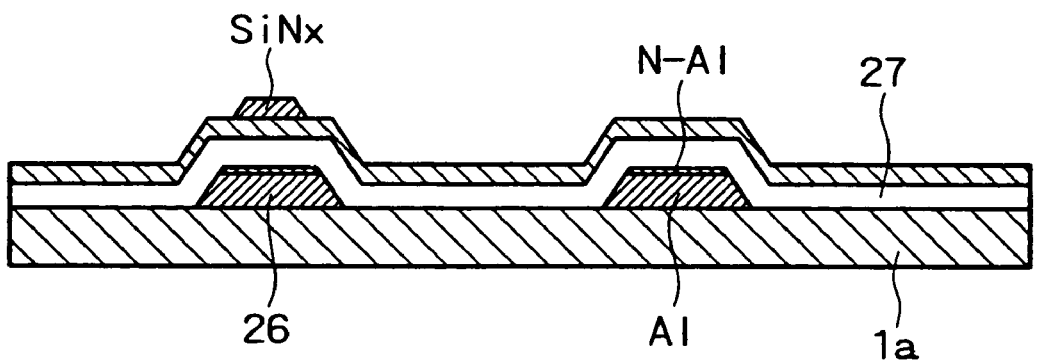
FIG. 9 is a schematic sectional view sequentially showing processes of the fabrication of the display device array substrate according to the first embodiment.

Next, the gate insulator 27 about 300 nm thick is formed from silicon oxide (SiOx) typically by plasma CVD, and a hydrogenated amorphous silicon film (a-Si:H) about 50 nm thick and a silicon nitride film (SiNx) about 300 nm thick are formed thereon (FIG. 8). A silicon nitride film (SiNx) is then patterned by light exposure from backside using the gate electrode as a mask to form a channel protective film (FIG. 9).

Figure 10:
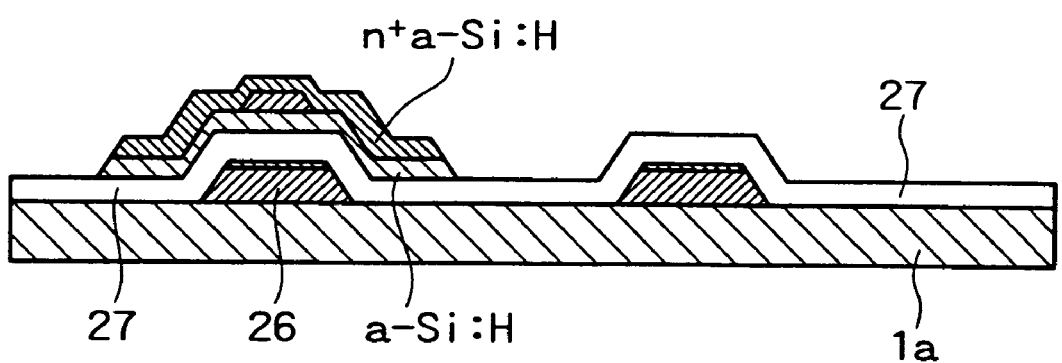
FIG. 10 is a schematic sectional view sequentially showing processes of the fabrication of the display device array substrate according to the first embodiment.

A n+ type hydrogenated amorphous silicon film ($n^+$a-Si:H) about 50 nm thick being doped with phosphorus is formed, and the hydrogenated amorphous silicon film (a-Si:H) and the $n^+$ type hydrogenated amorphous silicon film ($n^+$a-Si:H) are patterned (FIG. 10).

Next, an aluminum alloy film (Al) about 300 nm thick is formed, and subsequently a nitrogen-containing aluminum alloy film (N—Al) about 30 nm thick is formed thereon by reactive sputtering in combination with nitrogen addition. The ratio ($N_2$/Al) of the flow rate of $N_2$ to that of Ar is arbitrarily set depending on the target nitrogen content in the nitrogen-containing aluminum alloy film and is generally appropriately set within a range of 0.07 to 0.16, as in the formation of the multilayer aluminum alloy film shown in FIG. 7.

Figure 11:
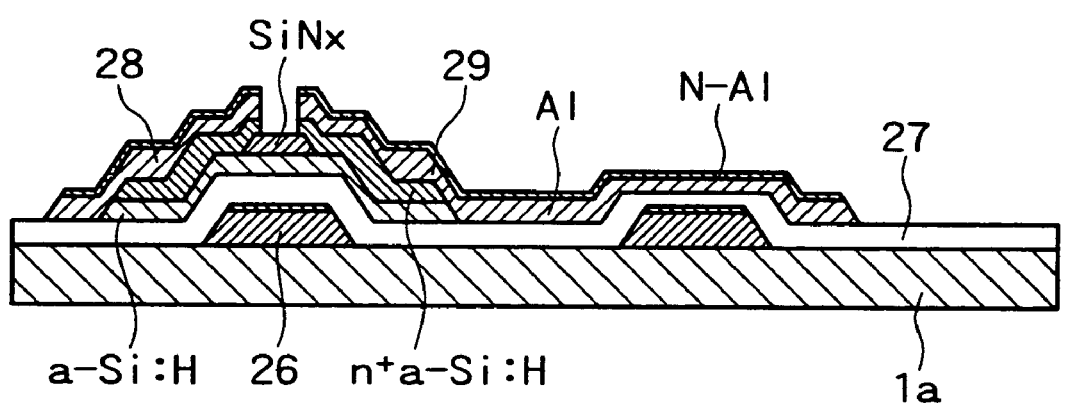
FIG. 11 is a schematic sectional view sequentially showing processes of the fabrication of the display device array substrate according to the first embodiment.

The resulting multilayer aluminum alloy film as an outermost layer is patterned by photolithography to thereby form patterns of a source electrode 28 and a drain electrode 29 (FIG. 11). The source electrode 28 is integrated with a data line. The drain electrode 29 is to be in contact with the pixel electrode 5. In this procedure, the corrosion of the aluminum alloy film by an alkaline developer is inhibited due to the corrosion resistance of the nitrogen-containing aluminum alloy film (N—Al) serving as the surface layer of the multilayer aluminum alloy film. The $n^+$ type hydrogenated amorphous silicon film ($n^+$a-Si:H) on the channel protective film (SiNx) is removed by using the source electrode 28 and the drain electrode 29 as a mask.

Figure 12:
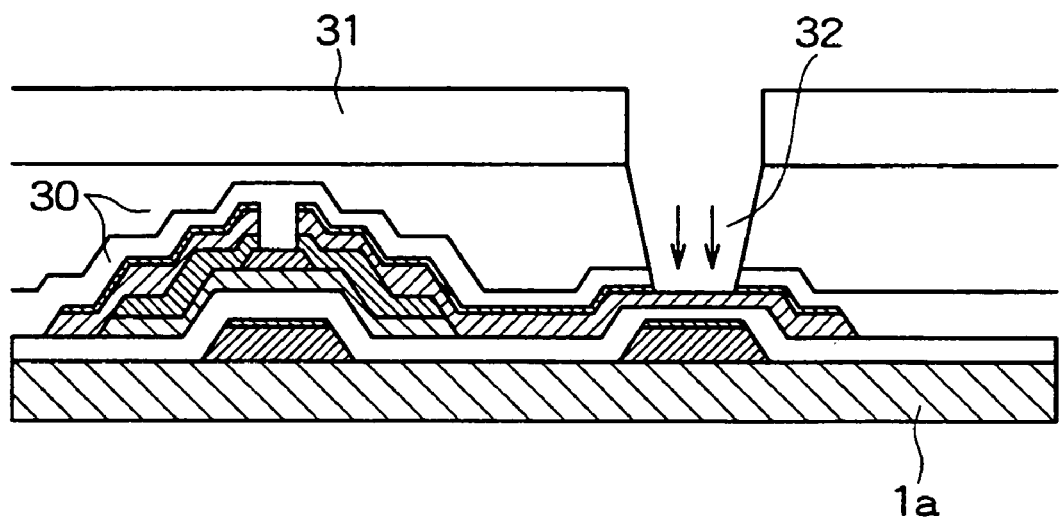
FIG. 12 is a schematic sectional view sequentially showing processes of the fabrication of the display device array substrate according to the first embodiment.

A silicon nitride film 30 about 300 nm thick serving as a protective film is formed typically by plasma CVD. In this procedure, the silicon nitride film 30 is formed at temperatures of about 300° C. A photoresist layer 31 is formed on the silicon nitride film 30, the silicon nitride film 30 is patterned, and a contact hole 32 is formed in the silicon nitride film 30 typically by dry etching (FIG. 12). The work is further subjected to overetching of about 70% to 500% in terms of etching time to thereby remove the nitrogen-containing aluminum alloy film.

Figure 13:
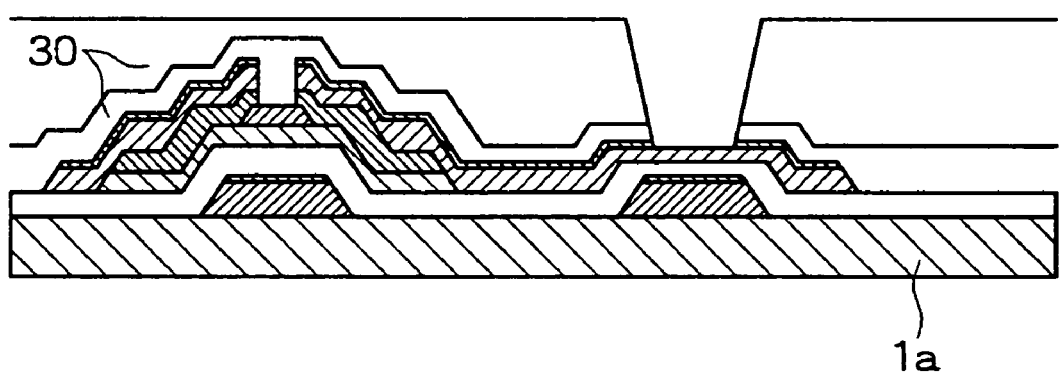
FIG. 13 is a schematic sectional view sequentially showing processes of the fabrication of the display device array substrate according to the first embodiment.

The work is subjected to ashing typically with oxygen plasma, and the photoresist layer 31 is stripped off typically with an amine stripping agent (FIG. 13).

Figure 14:
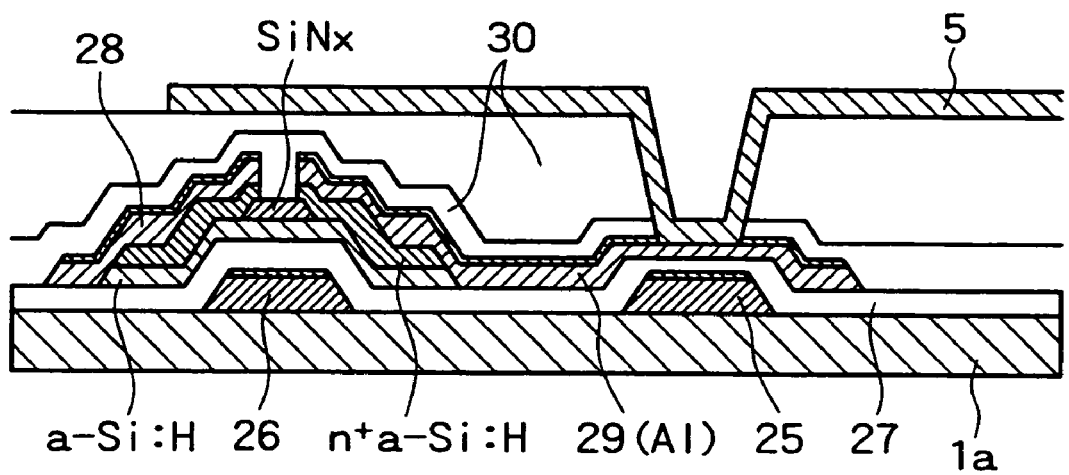
FIG. 14 is a schematic sectional view sequentially showing processes of the fabrication of the display device array substrate according to the first embodiment.

An ITO film about 40 nm thick is formed and patterned so as to form the pixel electrode. Thus, the TFT array substrate is prepared (FIG. 14).

In the TFT array substrate prepared according to the fabrication process, the nitrogen-containing aluminum alloy film as the surface layer (second layer) in the multilayer aluminum alloy film is removed so as to allow the pixel electrode 5 to be in direct contact with the drain electrode 29 comprising the aluminum alloy film containing no nitrogen (Al). Part of a deposit of the solid solution element or an intermetallic compound is exposed from the surface of the aluminum alloy film at the contact interface between the pixel electrode 5 and the drain electrode 29. The exposed area is more resistant to the formation of an oxide film by the action of the solid solution element than pure aluminum, and a highly insulative oxide film is not formed. The exposed area has a low resistance through which an electric current easily flows. Thus, the contact resistance is low even through the drain electrode 29, i.e., the aluminum alloy electrode, is brought into direct contact with the pixel electrode 5.

The above-mentioned thickness of the components such as the gate insulator 27, the silicon nitride film 30 and the photoresist film 31 is shown only by illustration, is not intended to limit the scope of the present invention and can be arbitrarily set according to necessity. The stripping agent for use herein is not specifically limited and is preferably one containing about 5 to about 70 percent by weight, and more preferably about 25 to about 70 percent by weight of monoethanolamine as a main component. The stripping agent of this type is generally used for removing a degenerated film or polymer film remained after etching of a metal material and can satisfactorily remove foreign matter (contaminated matter). The use of such a stripping agent for cleaning (rinsing) can yield a satisfactorily low contact resistance.

A stripping agent mainly containing an amine such as hydroxylamine, and a stripping agent containing about 5 to about 25 percent by weight of water in addition to an amine main component also have light etching action and can remove a thin film of aluminum oxide. These stripping agents, however, are expensive, exhibit a higher etching rate on an aluminum alloy and are somewhat difficult to control.

Next, the configuration and fabrication of a thin-film transistor for use in an array substrate according to a second embodiment of the present invention will be illustrated with reference to the drawings.

Figure 15:
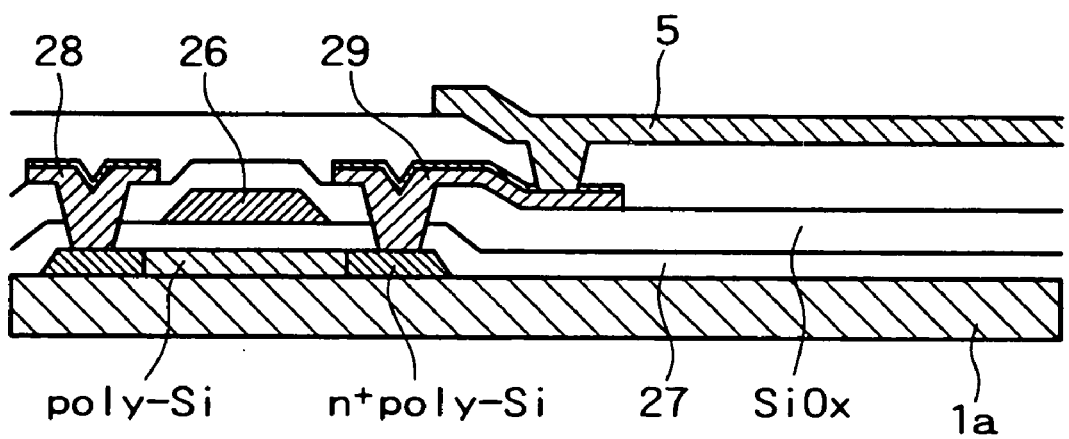
FIG. 15 is a schematic sectional view illustrating the configuration of a thin-film transistor applied to an display device array substrate according to a second embodiment of the present invention.

FIG. 15 is a schematic sectional view of the configuration of the thin-film transistor for use in the array substrate according to the second embodiment, in which the thin-film transistor has a top gate structure.

With reference to FIG. 15, a scanning line 25 comprising a multilayer aluminum alloy film is arranged on an insulating substrate 1*a*. Part of the scanning line 25 serves as a gate electrode 26 for controlling ON and OFF of the thin-film transistor. A data line comprising a multilayer aluminum alloy film is arranged so as to intersect the scanning line 25 with the interposition of an interlayer dielectric (SiOx). Part of the data line serves as a source electrode 28 of the thin-film transistor.

A pixel electrode 5 comprising an ITO film containing $In_2O_3$ and SnO is arranged in a pixel area on the interlayer dielectric (SiOx). A drain electrode 29 of the thin-film transistor comprising the multilayer aluminum alloy film serves as a connection electrode section to be electrically connected to the pixel electrode 5. More specifically, the first layer, i.e., the nitrogen-free aluminum alloy layer in the drain electrode 29 of the thin-film transistor comprising the multilayer aluminum alloy film is in direct contact with and is electrically connected to the pixel electrode 5, since the surface nitrogen-containing aluminum alloy layer of the multilayer aluminum alloy film is removed in an area where the pixel electrode 5 is in contact with the drain electrode 29.

When a gate voltage is fed via the scanning line to the gate electrode 26 in the TFT array substrate, the thin-film transistor turns ON, and a driving voltage previously fed to the data line is fed from the source electrode 28 via the drain electrode 29 to the pixel electrode 5, as in the first embodiment shown in FIG. 6. Upon feeding the driving voltage at a set level to the pixel electrode 5, a potential difference with the counter electrode 2 occurs so as to align the liquid crystal molecules in the liquid crystal layer 3 to thereby modulate the light, as shown in FIG. 5.

Next, the fabrication of the TFT array substrate shown in FIG. 15 will be illustrated. The thin-film transistor arranged in the array substrate according to the second embodiment has a top gate structure comprising a polysilicon film (poly-Si) as a semiconductor layer. FIGS. 16 to 22 are schematic diagrams sequentially showing the fabrication processes of the TFT array substrate according to the second embodiment.

Figure 16:
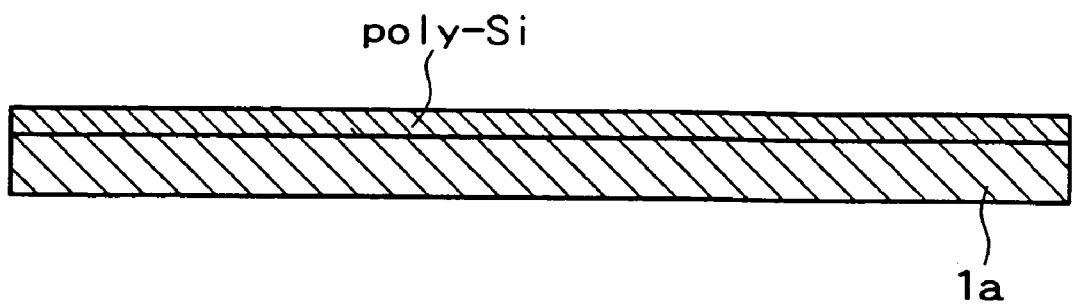
FIG. 16 is a schematic sectional view sequentially showing processes of a fabrication of the display device array substrate according to the second embodiment.

Initially, a silicon nitride film (SiNx) about 50 nm thick, a silicon oxide film (SiOx) about 100 nm thick, and a hydrogenated amorphous silicon film (a-Si:H) about 50 nm thick are formed on an insulating substrate 1*a* typically made of glass typically by plasma CVD at a substrate temperature of, for example, about 300° C. The hydrogenated amorphous silicon film (a-Si:H) is converted into a polysilicon film by heat treatment and laser annealing. The heat treatment is carried out, for example, by atmospheric heat treatment at about 470° C. for about one hour, followed by dehydrogenation. The hydrogenated amorphous silicon film (a-Si:H) is then irradiated with laser light at an energy of about 230 mJ/cm$^2$ typically using an excimer laser annealing system to thereby yield a polysilicon film (poly-Si) about 0.3 μm thick (FIG. 16). These fabrication conditions are shown only by illustration and can be arbitrarily set according to necessity.

Figure 17:
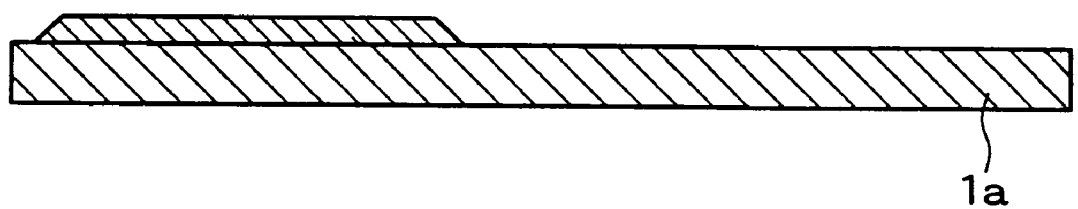
FIG. 17 is a schematic sectional view sequentially showing processes of the fabrication of the display device array substrate according to the second embodiment.

The polysilicon film (poly-Si) is then patterned typically by plasma etching (FIG. 17).

Next, a gate insulator 27 about 100 nm thick is formed as a silicon oxide film (SiOx). A nitrogen-free aluminum alloy film (Al) about 200 nm thick serving as a gate electrode 26 integrated with a scanning line is formed on the gate insulator 27 typically by sputtering. Subsequently, a nitrogen-containing aluminum alloy film (N—Al) about 30 nm thick is formed thereon by reactive sputtering in combination with nitrogen addition. In this procedure, the ratio of the flow rate of $N_2$ to that of Ar is set at about 0.07 to about 0.16.

Figure 18:
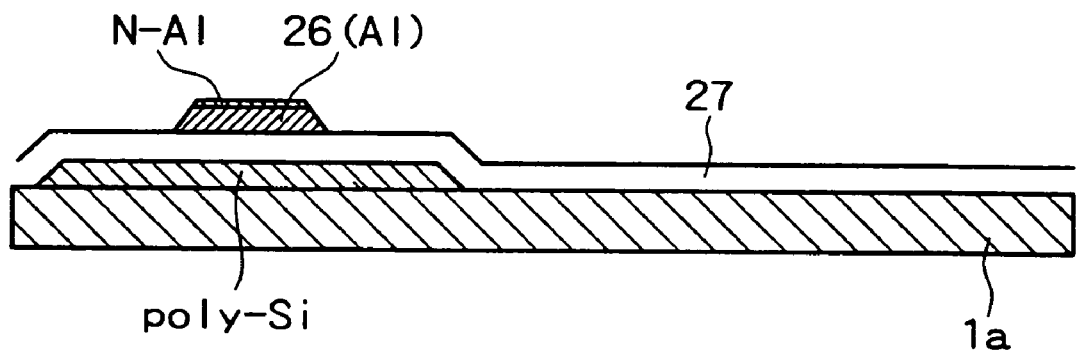
FIG. 18 is a schematic sectional view sequentially showing processes of the fabrication of the display device array substrate according to the second embodiment.
Figure 19:
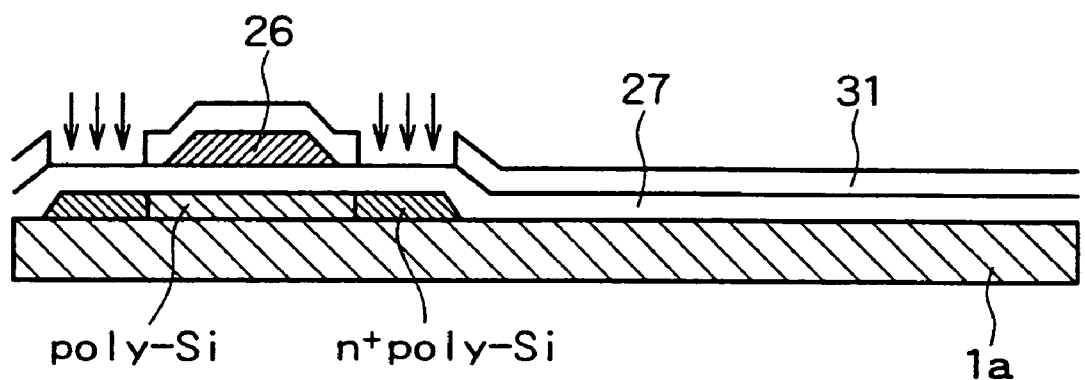
FIG. 19 is a schematic sectional view sequentially showing processes of the fabrication of the display device array substrate according to the second embodiment.

The resulting multilayer aluminum alloy film is patterned by photolithography to thereby form patterns of a gate electrode and a scanning line (FIG. 18). In this procedure, the corrosion of the aluminum alloy film caused by the alkaline developer is prevented by the excellent corrosion resistance of the nitrogen-containing aluminum alloy film (N—Al).

Next, a photoresist film 31 is formed as a mask, phosphorus, for example, is doped at about 50 keV in an amount of $1 \times 10^{15}$ per square centimeter to thereby form a n$^+$ type polysilicon film (n$^+$ poly-Si) in part of the polysilicon film (poly-Si) typically using an ion injection apparatus. The photoresist film 31 is then stripped, and the dopant is diffused by heat treatment at about 500° C.

A silicon oxide film (SiOx) as an interlayer dielectric is formed to a thickness of about 500 nm at a substrate temperature of about 300° C. typically using a plasma CVD system. A photoresist film is then formed and patterned in the same way as above, and the interlayer dielectric (SiOx) and the silicon oxide film as the gate insulator 27 are dry-etched to thereby form a contact hole. An aluminum alloy film (Al) is formed typically to a thickness of about 450 nm by sputtering, and a nitrogen-containing aluminum alloy film (N—Al) is then formed thereon typically to a thickness of about 30 nm by reactive sputtering in combination with nitrogen addition.

Figure 20:
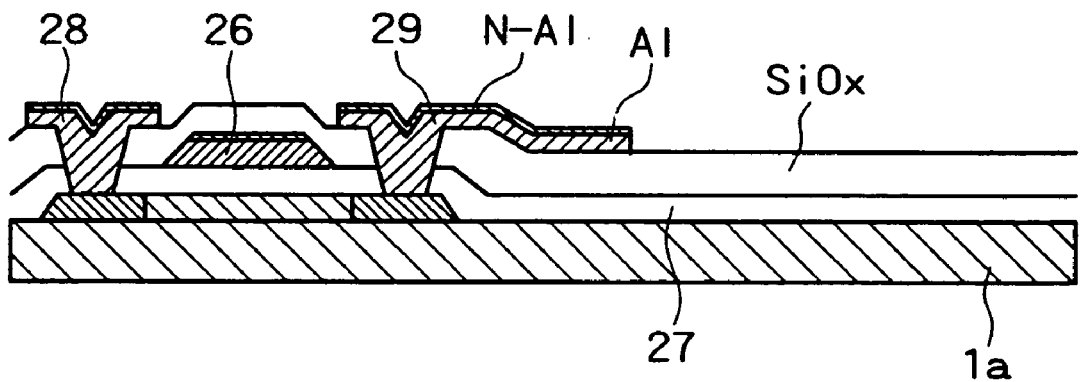
FIG. 20 is a schematic sectional view sequentially showing processes of the fabrication of the display device array substrate according to the second embodiment.

The ratio of the flow rate of $N_2$ to that of Ar in this procedure is controlled at 0.07 to 0.16. Next, the nitrogen-containing aluminum alloy film is patterned by photolithography to thereby form a source electrode 28 integrated with a data line, and a drain electrode 29 (FIG. 20). In this procedure, these electrodes are protected from corrosion due to the alkaline developer.

Figure 21:
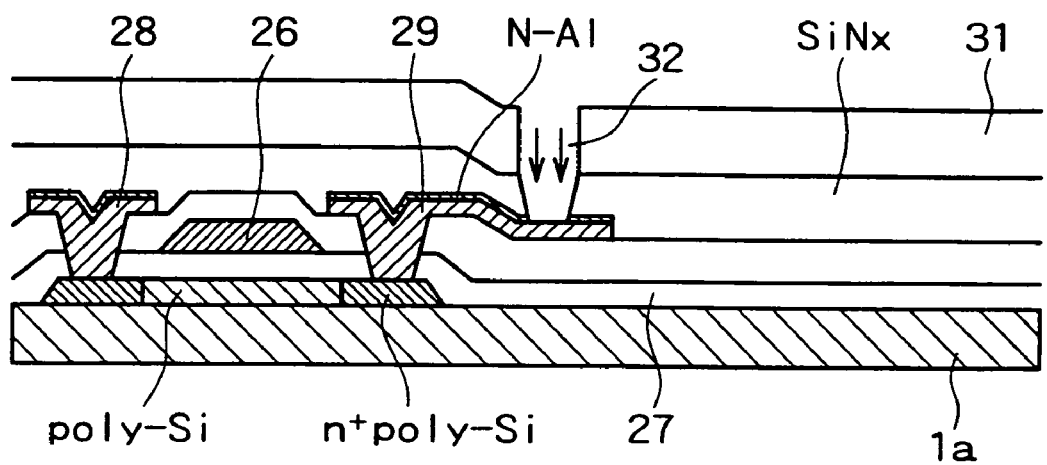
FIG. 21 is a schematic sectional view sequentially showing processes of the fabrication of the display device array substrate according to the second embodiment.

A silicon nitride film (SiNx) as an interlayer dielectric is formed to a thickness of about 500 nm at a substrate temperature of about 300° C. typically using a plasma CVD system. A photoresist film 31 is formed and patterned to form a mask, the silicon nitride film (SiNx) is patterned by using the mask, and a contact hole 32 is formed in the silicon nitride film (SiNx) typically by dry etching. After the completion of etching of the silicon nitride film (SiNx), the work is further subjected to overetching of about 70% to 500% in terms of etching time to thereby remove the nitrogen-containing aluminum alloy film (N—Al) (FIG. 21).

Figure 22:
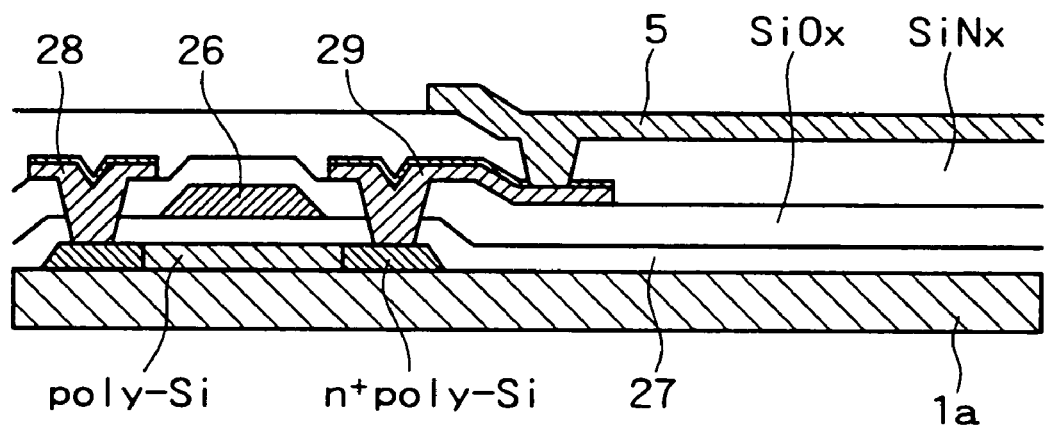
FIG. 22 is a schematic sectional view sequentially showing processes of the fabrication of the display device array substrate according to the second embodiment.

The work is subjected to ashing process typically with oxygen plasma, and the photoresist is stripped with an amine stripping agent in the same way as above. An ITO film about 100 nm thick is formed typically by sputtering and is patterned by wet etching to thereby form a pixel electrode 5. As a result of this procedure, the drain electrode 29 is brought into direct contact with the pixel electrode 5 (FIG. 22).

The work is annealed at about 350° C. for one hour for stabilizing the properties of the transistor and thereby yields a polysilicon TFT array substrate.

The resulting TFT array substrate according to the second embodiment and a liquid crystal display device having the TFT array substrate achieve the same advantages as the first embodiment. A liquid crystal display device as a flat display device shown in FIG. 5 can be prepared by using the TFT array substrates according to the first and/or second embodiment.

An alignment film may be formed on the TFT array substrate by applying a polyimide thereto, drying and then rubbing the applied film.

The counter substrate 2 shown in FIG. 5 may be prepared in the following manner. Initially, a shielding film 9 is formed on an insulating substrate 1a typically by pattering a chromium film (Cr) in a matrix manner. Red, green and blue color filters 8 made of a resin are formed in spaces in the matrix shielding film 9. An optically transparent conductive film such as an ITO film is formed as a common electrode 7 over the shielding film 9 and the color filters 8 to thereby yield the counter substrate 2. An alignment layer 11 is formed on an outermost surface of the counter substrate 2 by applying a polyimide, and drying and rubbing the applied film.

The TFT array substrate 1 and the counter substrate 2 are arranged so as to their alignment layers face each other and are bonded using a sealing material 16 typically made of a resin, except for a filling port. In this procedure, the gap (distance) between the two substrates is kept substantially constant, for example, by interposing a spacer 15 therebetween.

The work (blank cell) is placed in vacuo, and the pressure is gradually increased to the normal atmospheric pressure while the filling port is dipped in a liquid crystal material containing liquid crystal molecules. Thus, the blank cell is filled with the liquid crystal material to form a liquid crystal layer 3, and the filling port is sealed. Polarizers 10 are attached to outermost surfaces of the cell to thereby yield a liquid crystal panel. In addition, a driver circuit for driving the liquid crystal display device is electrically connected to the liquid crystal panel and is arranged on the side or back of the liquid crystal panel.

The liquid crystal panel is then integrated with a frame having an opening which defines the display screen of the liquid crystal panel, a backlight 22 constituting a surface light source, an optical waveguide 20 and a supporting frame 23 to thereby yield a liquid crystal display device.

EXAMPLES

The present invention will be illustrated in further detail with reference to several examples below, which are not intended to limit the scope of the present invention.

The contact resistance in direct contact between aluminum alloy wirings and the pixel electrode 5 on the array substrate according to the present invention was determined. The results are shown in Table 1.

The determination was carried out in the following manner.

1) Configuration of the pixel electrode: Indium tin oxide (ITO) comprising indium oxide and 10 percent by weight of tin oxide and having a thickness of 200 nm, or indium zinc oxide (IZO) comprising indium oxide and 10 percent by weight of zinc oxide and having a thickness of 200 nm 2) Configuration of the aluminum alloy film: The contents of the alloy components are shown in Table 1.

3) Conditions for heat treatment: A dielectric film (SiNx) was formed to a thickness of 300 nm, and the work was subjected to heat treatment at 300° C. in vacuo for one hour.

4) Light etching and cleaning: The dielectric film (SiNx) was subjected to dry etching using fluorine-containing plasma, and each of the aluminum alloy wiring materials was etched about 5 nm, and the contamination (foreign matter) on the surface layer was removed by using a stripping agent ("Stripping solution 106" available from Tokyo Ohka Kogyo Co., Ltd.).

Figure 23:
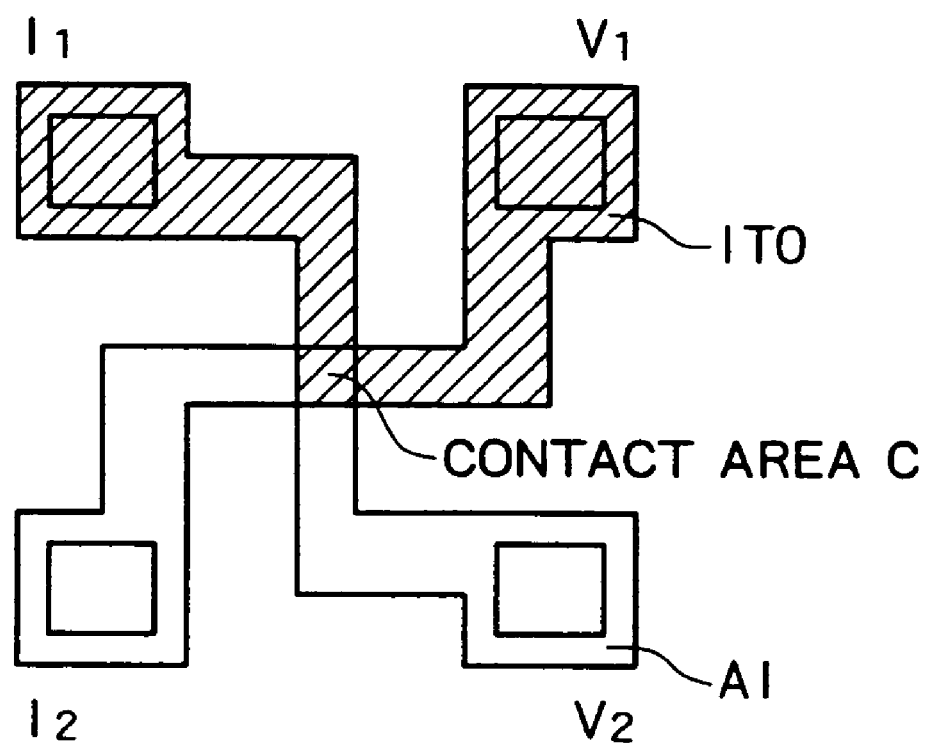
FIG. 23 is a schematic diagram of a Kelvin pattern used in the determination of the contact resistance between an aluminum alloy film and a pixel electrode.

5) Determination of contact resistance:

A Kelvin pattern as shown in FIG. 23 was formed, and the contact resistance was determined by a four-terminal method, in which an electric current was passed through the ITO- or IZO-Al alloy, and the voltage drop between the ITO or IZO and the Al alloy was determined using other terminals. More specifically, a current I was passed through between $I_1$ and 12 in FIG. 23, and the voltage V between $V_1$ and $V_2$ was monitored to thereby determine the contact resistance R of the contact area C according to the following equation: $R=(V_2-V_1)/I$. The Kelvin pattern was prepared in the following manner.

The additive elements in the aluminum alloy were analyzed by inductively coupled plasma (ICP) emission analysis.

Examples 1 and 2

A silicon wafer bearing an oxide film ($SiO_2$ thermally grown oxide film) 400 nm on its surface for establishing insulation of the substrate was used instead of the glass substrate. A nitrogen-free aluminum alloy film 300 nm thick was formed on the silicon wafer, a nitrogen-containing aluminum alloy film 30 nm thick was formed thereon to form a multilayer aluminum alloy film, the multilayer aluminum alloy film was patterned, and a dielectric film (SiNx) 300 nm thick was formed by chemical vapor deposition (CVD). The work was as intact subjected to heat treatment in a vacuum film-forming chamber for one hour and was taken out. A 80-μm square contact hole was patterned by photolithography, followed by etching with fluorine-containing plasma to thereby form a contact hole. In this procedure, overetching about 100% in terms of time was carried out in addition to the etching of the dielectric film. This treatment removed about 35 nm thick (about 11% of the film thickness) of the surface layer of the multilayer aluminum alloy film. Thus, the nitrogen-containing aluminum alloy film as the second layer (surface layer) was substantially fully removed.

The work was subjected to ashing with oxygen plasma and stripping of the resist with a stripping agent. The resist was stripped off by rinsing with a stripping agent "Stripping solution 106" available from Tokyo Ohka Kogyo Co., Ltd. at 100° C. for 10 minutes. This procedure removed contaminated substances such as fluorides, oxides and carbon on the surface layer of the aluminum alloy film. An ITO or IZO film was formed thereon to a thickness of 200 nm by sputtering and was patterned.

Next, the contact resistance was determined using a four-terminal manual prover and a semiconductor parameter analyzer "HP 4156A" available from Hewlett Packard. The contact resistance R was defined as $[(V_2-V_1)/I]$. Thus, the pure resistance at the interface between the ITO film or the IZO film and the aluminum alloy film can be determined without any influence by the wiring resistance.

TABLE 1

| Metal electrode film | Pixel electrode | |
| --- | --- | --- |
|  | ITO | IZO |
| Pure aluminum | $1.5 \times 10^5$ Ω | — |
| Al-2 at % Nd | $8.4 \times 10^4$ Ω | $8.1 \times 10^4$ Ω |
| Mo | $1.6 \times 10^1$ Ω | $1.1 \times 10^1$ Ω |
| Al-2 at % Ni-0.6 at % Nd | $1.7 \times 10^1$ Ω | $1.2 \times 10^1$ Ω |
| Al-1.2 at % Ni-0.4 at % Y | $2.2 \times 10^1$ Ω | $1.3 \times 10^1$ Ω |

TABLE 1-continued

| Metal electrode film | Pixel electrode | |
| --- | --- | --- |
| | ITO | IZO |
| Example 1 | $3.2 \times 10^1$ Ω | — |
| Example 2 | $3.5 \times 10^1$ Ω | — |

Example 1: A multilayer film comprising a nitrogen-containing Al-2 at % Ni-0.6 at % Nd and a nitrogen-free Al-2 at % Ni-0.6 at % Nd
Example 2: A multilayer film comprising a nitrogen-containing Al-1.2 at % Ni-0.4 at % Y and a nitrogen-free Al-1.2 at % Ni-0.4 at % Y Table 1 shows that the contact resistance in direct contact between the ITO film and a pure aluminum wiring is $1.5 \times 10^5$ Ω, and that between the ITO film and an Al-2 at % Nd film as a representative aluminum alloy wiring is $8.4 \times 10^4$ Ω. The contact resistance between the ITO film and an Al-2 at % Nd wiring with the interposition of Mo as a barrier metal is $1.66 \times 10^1$ Ω.

The contact resistance is $1.7 \times 10^1$ Ω in direct contact between the ITO film and the Al-1.2 at % Ni-0.6 at % Nd film, is $2.2 \times 10^1$ Ω in direct contact between the ITO film and the Al-1.2 at % Ni-0.4 at % Y film, is $1.5 \times 10^1$ Ω in direct contact between the ITO film and an Al-2 at % Ni-1 at % Fe film, and is $1.5 \times 10^1$ Ω in direct contact between the ITO film with an Al-2 at % Ni-1 at % Co film, all of which are substantially equivalent to that in indirect contact with the interposition of Mo as a barrier metal, i.e., a conventional configuration.

In contrast, the contact resistance in direct contact between the ITO film as the pixel electrode and the multilayer aluminum alloy film according to Example 1 is $3.2 \times 10^1$ Ω, and the contact resistance between the ITO film as the pixel electrode and the multilayer aluminum alloy film according to Example 2 is $3.5 \times 10^1$ Ω, both of which are satisfactorily low contact resistances. In Example 1, a nitrogen-containing Al-2 at % Ni-0.6 at % Nd film was formed on an Al-2 at % Ni-0.6 at % Nd film to form the multilayer aluminum alloy film, and the nitrogen-containing aluminum alloy film was removed by overetching during etching of a contact hole in the dielectric film so as to allow the pixel electrode to be in direct contact with the Al-2 at % Ni-0.6 at % Nd film. In the multilayer aluminum alloy film according to Example 2, an Al-1.2 at % Ni-0.4 at % Y film was used instead of the Al-2 at % Ni-0.6 at % Nd film.

The relationship between the contact resistance and the overetching in a contact hole in the multilayered film comprising a nitrogen-containing Al-2 at % Ni-0.6 at % Nd film and a nitrogen-free Al-2 at % Ni-0.6 at % Nd film is shown in FIG. 24.

FIG. 24 shows that the contact resistance is considerably high when the nitrogen-containing aluminum alloy film remains at an overetching of 50%, but the contact resistance is significantly low when the nitrogen-containing aluminum alloy film is substantially fully removed by etching. The contact resistance is satisfactorily low at an overetching of about 300% to about 400%. If the overetching is further carried out, however, the nitrogen-free Al—Ni—Nd layer as the underlying layer is removed, resulting in an abruptly increasing contact resistance.

The cross sections of the overetched portions formed in the test were observed under a scanning electron microscope (SEM). At an overetching of 50%, part of the nitrogen-containing aluminum alloy film remains at the bottom of the contact hole, indicating that the residual nitrogen-containing aluminum alloy film increases the contact resistance. At an overetching of 70% to 500%, the nitrogen-containing aluminum alloy film is substantially fully removed, and the pixel electrode is in direct contact with the underlying layer (first layer), i.e., the nitrogen-free Al—Ni—Nd film in the multilayer aluminum alloy film, which may significantly reduce the contact resistance.

To effectively exhibit the advantages of the multilayer aluminum alloy film, the thickness of the nitrogen-containing aluminum alloy film serving as a surface layer is preferably 5 nm to 200 nm, and more preferably 30 nm to 100 nm.

A standard developing time in the case of an organic alkaline developer is from about 30 seconds to about 1 minute. To ensure the function of the nitrogen-containing aluminum alloy film as a barrier film during the developing process, the thickness thereof should be preferably about 5 nm or more, and more preferably about 30 nm or more. To remove the nitrogen-containing aluminum alloy film by overetching efficiently, the thickness should be preferably about 200 nm or less, and more preferably about 100 nm or less.

The content of nitrogen in the nitrogen-containing aluminum alloy film is preferably from 13 atomic percent to 50 atomic percent for satisfactory corrosion resistance against an alkaline developer. If the nitrogen content is less than the above-specified range, satisfactory alkali resistance may not be obtained. In contrast, the nitrogen content cannot substantially exceed 50 atomic percent.

The thickness of the nitrogen-free aluminum alloy film is preferably 5 nm to 1000 nm, and more preferably 30 nm to 500 nm. The thickness of gate, source/drain electrodes is generally from about 200 to about 300 nm. To ensure a low contact resistance between the nitrogen-free aluminum alloy film and the pixel electrode, the thickness should be preferably about 5 nm or more and more preferably about 30 nm or more. In contrast, if the thickness is excessively large, the resulting insulator cannot cover the aluminum alloy film fully and is not suitable in practical use because of lowering of TFT property. Thus, the thickness is preferably 1000 nm or less, and more preferably 500 nm or less.

The thickness of the nitrogen-free aluminum alloy film and the nitrogen-containing aluminum alloy film can be controlled by forming an aluminum alloy film to a set thickness typically by sputtering without nitrogen addition, and forming a nitrogen-containing aluminum alloy film to a set thickness typically by reactive sputtering in combination with nitrogen addition. The optimal thickness of the nitrogen-containing aluminum alloy film should be preferably set in consideration of the composition of a mixture of $N_2$ and Ar gas and the alkali resistance of the nitrogen-containing aluminum alloy film, because the nitrogen content in the nitrogen-containing aluminum alloy film varies depending on the composition of the mixture of $N_2$ and Ar gas, and the barrier action of the nitrogen-containing aluminum alloy film against a basic solution varies depending on the nitrogen content.

Table 1 shows that the multilayered film (two-layer film) has a contact resistance as high as twice that of a single layer film. This is probably because contaminated matter such as fluorides and carbon is increased on the surface due to overetching.

The contact area between the pixel electrode and the connection wiring (aluminum alloy film) used in the determination of the contact resistance is 80-μm square. As is described above, the multilayer aluminum alloy film containing a nitrogen-containing aluminum alloy film as a surface layer can ensure a satisfactorily low contact resistance which is substantially equivalent to that of a single layer aluminum alloy film and is about $1/10^4$ that in direct contact between an ITO film and a pure aluminum wiring film.

A liquid crystal display device having the above configuration was prepared and was found to have a production yield and display quality equivalent to those of conventional liquid crystal display devices using an ITO film and a barrier metal. The liquid crystal display devices according to the present invention can have improved corrosion resistance by configuring a multilayer film containing a nitrogen-containing aluminum alloy film without using a barrier metal and can exhibit, by an easy and low-cost configuration, performance equivalent to conventional liquid crystal display devices.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A display device comprising:
a transparent insulating substrate;
a thin-film transistor arranged on the transparent insulating substrate;
a pixel electrode comprising a transparent electrode; and
an aluminum alloy film for electrically connecting between the thin-film transistor and the pixel electrode,
wherein the aluminum alloy film is a multilayer aluminum alloy film comprising:
a first aluminum alloy layer comprising an aluminum alloy being substantially free from nitrogen; and
a second aluminum alloy layer being arranged on the first aluminum alloy layer and comprising a nitrogen-containing aluminum alloy, and
wherein the second aluminum alloy layer has been removed at least in a region where the pixel electrode is in contact with the multilayer aluminum alloy film, and
the pixel electrode is directly connected to the first aluminum alloy layer in said region where the second aluminum alloy was removed from the multilayer aluminum alloy film.

2. The display device according to claim 1, wherein the aluminum alloy comprises at least 0.1 to 6 atomic percent of Ni as an alloy component.

3. The display device according to claim 2, wherein the aluminum alloy further comprises 0.1 to 6 atomic percent of at least one element selected from Nd, Y, Fe and Co as an alloy component.

4. The display device according to claim 1, wherein the second aluminum alloy layer has a thickness of 5 to 200 nm.

5. The display device according to claim 1, wherein the second aluminum alloy layer comprises 13 to 50 atomic percent of nitrogen.

6. A method for fabricating a display device, comprising:
forming a first aluminum alloy layer on a transparent insulating substrate, the first aluminum alloy layer comprising an aluminum alloy being substantially free from nitrogen;
forming a second aluminum alloy layer on the first aluminum alloy layer to thereby form a multilayer aluminum alloy film, the second aluminum alloy layer comprising an aluminum alloy containing nitrogen;
patterning the multilayer aluminum alloy film comprising the first aluminum alloy layer and the second aluminum alloy layer;
forming a dielectric film so as to cover the multilayer aluminum alloy film;
forming a contact hole in the dielectric film; etching the second aluminum alloy layer at least in a region where the multilayer aluminum alloy film is in contact with the contact hole; and
forming a pixel electrode on the dielectric film and directly connecting the pixel electrode to the first aluminum alloy layer via the contact hole in a region of the multilayer aluminum alloy film where the second aluminum alloy was removed.

7. The method according to claim 6, wherein the step of forming a contact hole in the dielectric film also serves as the step of etching the second aluminum alloy layer.

* * * * *

UNITED STATES PATENT AND TRADEMARK OFFICE
CERTIFICATE OF CORRECTION

PATENT NO. : 7,262,085 B2 Page 1 of 1
APPLICATION NO. : 11/091442
DATED : August 28, 2007
INVENTOR(S) : Gotoh et al.

It is certified that error appears in the above-identified patent and that said Letters Patent is hereby corrected as shown below:

On the title page, Item (73), the Assignee information is incorrect. Item (73) should read:

-- Assignee: Kabushiki Kaisha Kobe Seiko Sho (Kobe Steel, Ltd.), Kobe-shi (JP) --

Signed and Sealed this

Sixth Day of November, 2007

JON W. DUDAS
*Director of the United States Patent and Trademark Office*